US012683557B2

(12) United States Patent
Chen et al.

(10) Patent No.: US 12,683,557 B2
(45) Date of Patent: Jul. 14, 2026

(54) AI-ASSISTED POWER AMPLIFIER OPTIMIZATION

(71) Applicant: MediaTek Inc., Hsinchu City (TW)

(72) Inventors: Po-Yu Chen, Hsinchu City (TW); Hao Chen, Hsinchu City (TW); Yi-Min Tsai, Hsinchu City (TW); Hao Yun Chen, Hsinchu City (TW); Hsien-Kai Kuo, Hsinchu City (TW); Hantao Huang, Singapore (SG); Hsin-Hung Chen, Hsinchu City (TW); Yu Hsien Chang, Hsinchu City (TW); Yu-Ming Lai, Hsinchu City (TW); Lin Sen Wang, Hsinchu City (TW); Chi-Tsan Chen, Hsinchu City (TW); Sheng-Hong Yan, Hsinchu City (TW)

(73) Assignee: MediaTek Inc., Hsinchu City (TW)

( * ) Notice: Subject to any disclaimer, the term of this patent is extended or adjusted under 35 U.S.C. 154(b) by 908 days.

(21) Appl. No.: 17/857,132

(22) Filed: Jul. 4, 2022

(65) Prior Publication Data

US 2023/0006611 A1 Jan. 5, 2023

Related U.S. Application Data

(60) Provisional application No. 63/218,435, filed on Jul. 5, 2021.

(51) Int. Cl.
H03F 1/32 (2006.01)
G06F 18/214 (2023.01)
(Continued)

(52) U.S. Cl.
CPC ......... H03F 1/3205 (2013.01); G06F 18/214 (2023.01); G06N 3/063 (2013.01); H03F 1/0222 (2013.01)

(58) Field of Classification Search
CPC ................. H03F 1/3205; H03F 1/0222; H03F 2201/3224; H03F 1/3247; H03F 3/195;
(Continued)

(56) References Cited

U.S. PATENT DOCUMENTS 10,305,553 B2 5/2019 O'Shea
2002/0105384 A1 8/2002 Dent
(Continued)

FOREIGN PATENT DOCUMENTS

FR 2538553 A * 12/2012 ............... H03F 1/32

OTHER PUBLICATIONS

Chance Tarver, et al. "Design and Implementation of a Neural Network Based Predistorter for Enhanced Mobile Broadband," arXiv:1907.00766.

Primary Examiner — Andrea Lindgren Baltzell
Assistant Examiner — Khiem D Nguyen
(74) Attorney, Agent, or Firm — Tong J. Lee

(57) ABSTRACT

A compensator compensates for the distortions of a power amplifier circuit. A power amplifier neural network (PAN) is trained to model the power amplifier circuit using pre-determined input and output signal pairs that characterize the power amplifier circuit. Then a compensator is trained to pre-distort a signal received by the PAN. The compensator uses a neural network trained to optimize a loss between a compensator input and a PAN output, and the loss is calculated according to a multi-objective loss function that includes one or more time-domain loss function and one or more frequency-domain loss functions. The trained compensator performs signal compensation to thereby output a pre-distorted signal to the power amplifier circuit.

21 Claims, 6 Drawing Sheets

(51) Int. Cl.
*G06N 3/063* (2023.01)
*H03F 1/02* (2006.01)

(58) Field of Classification Search
CPC ........ H03F 3/245; H03F 1/3241; H03F 3/213;
H03F 2200/451; G06F 18/214; G06N
3/063; G06N 3/045; G06N 3/09; G06N
3/084; G06N 3/08; G06V 10/82
USPC ................................................. 330/311, 149
See application file for complete search history.

(56) References Cited

U.S. PATENT DOCUMENTS

| | | | |
|---|---|---|---|
| 2017/0000553 | A1 | 1/2017 | Wiener |
| 2019/0363742 | A1 | 11/2019 | Megretski |
| 2020/0295975 | A1 | 9/2020 | Li |

* cited by examiner

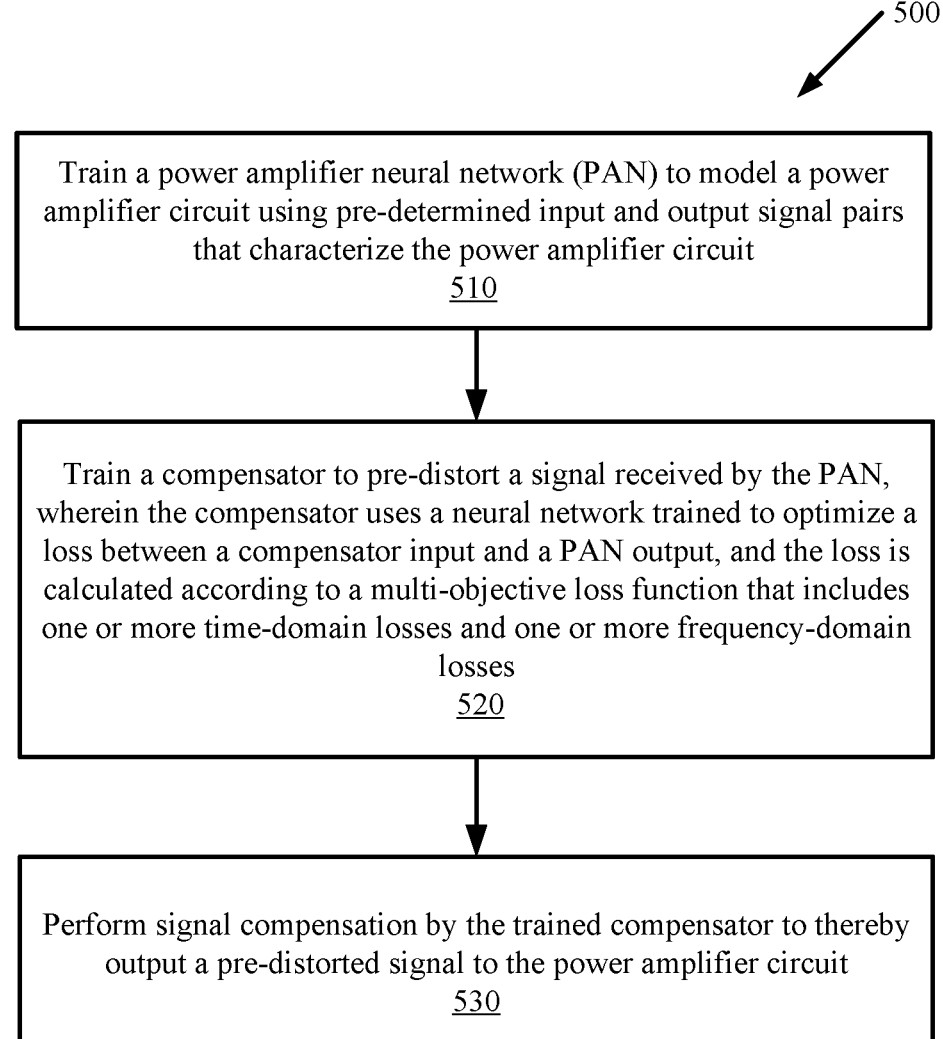

Train a power amplifier neural network (PAN) to model a power amplifier circuit using pre-determined input and output signal pairs that characterize the power amplifier circuit
510

Train a compensator to pre-distort a signal received by the PAN, wherein the compensator uses a neural network trained to optimize a loss between a compensator input and a PAN output, and the loss is calculated according to a multi-objective loss function that includes one or more time-domain losses and one or more frequency-domain losses
520

Perform signal compensation by the trained compensator to thereby output a pre-distorted signal to the power amplifier circuit
530

FIG. 5

AI-ASSISTED POWER AMPLIFIER OPTIMIZATION

CROSS-REFERENCE TO RELATED APPLICATIONS

This application claims the benefit of U.S. Provisional Application No. 63/218,435 filed on Jul. 5, 2021, the entirety of which is incorporated by reference herein.

TECHNICAL FIELD

Embodiments of the invention relate to the optimization of a power amplifier using neural networks.

BACKGROUND

In modern wireless communication systems, radio frequency (RF) circuits are a major source of signal impairments that degrade system throughput. Among other impairments, nonlinearity and memory effects can cause severe spectral regrowth. Spectral regrowth significantly degrades the signal quality due to high out-of-band power. Memory effects cause asymmetry in transmitted signals. These impairments become more severe and complicated in current and next-generation wireless systems where wide bandwidths, high frequencies, high power, and high-order modulation are used. Moreover, in an edge device of 5G communication systems, both the high transmission power and the limited supply voltage can worsen the non-linearity of RF circuits.

To overcome the aforementioned problems of power amplifiers, digital pre-distortion (DPD) has become a common and practical mechanism considering both integration complexity and effectiveness. A DPD generates a pre-distorted signal to compensate for the impairment caused by a power amplifier. Conventional techniques for DPD designs typically include the derivation of a mathematical power amplifier model and the calculation of the corresponding reverse function that characterizes a DPD. Due to the complex characteristics of 5G communication systems, designing RF components through mathematical modeling is a challenging task. Moreover, these mathematical models need numerous manual adjustments for various specification requirements. Thus, there is a need for the improvement of power amplifier designs.

SUMMARY

In one embodiment, a method of compensating for power amplifier distortions is provided. The method includes the steps of training a power amplifier neural network (PAN) to model a power amplifier circuit using pre-determined input and output signal pairs that characterize the power amplifier circuit; and training a compensator to pre-distort a signal received by the PAN. The compensator uses a neural network trained to optimize a loss between a compensator input and a PAN output, and the loss is calculated according to a multi-objective loss function that includes one or more time-domain loss function and one or more frequency-domain loss functions. The method further includes the step of performing signal compensation by the trained compensator to thereby output a pre-distorted signal to the power amplifier circuit.

In another embodiment, a system operative to compensate for power amplifier distortions is provided. The system includes memory to store neural network models and processing hardware coupled to the memory. The processing hardware is operative to train a PAN to model a power amplifier circuit using pre-determined input and output signal pairs that characterize the power amplifier circuit; and train a compensator to pre-distort a signal received by the PAN. The compensator uses a neural network trained to optimize a loss between a compensator input and a PAN output, and the loss is calculated according to a multi-objective loss function that includes one or more time-domain loss function and one or more frequency-domain loss functions. The processing hardware is further operative to perform signal compensation by the trained compensator to thereby output a pre-distorted signal to the power amplifier circuit.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIG. 5 is a flow diagram illustrating a method of compensating for distortions caused by a power amplifier according to one embodiment.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide an artificial-intelligence (AI)-based method and system to compensate for impairments caused by an RF circuit, such as distortions caused by a power amplifier. Initially, a first neural network is trained to model the characteristics of a power amplifier. Then a compensator is connected to an input end of the trained first neural network, where the compensator includes a second neural network. In one embodiment, the second neural network is a coefficient generator neural network (CGN) that is trained to generate filter coefficients for a digital pre-distorter (DPD). The DPD generates a pre-distorted signal to counteract power amplifier distortions. In another embodiment, the second neural network is a DPD neural network that is trained to generate a pre-distorted signal to counteract power amplifier distortions.

According to embodiments of the invention, the training of the first neural network and the second neural network may be based on a combination of one or more time-domain losses and one or more frequency-domain losses. For example, the time-domain losses may include the mean square error (MSE) and the error vector magnitude (EVM). The frequency-domain losses may include the mean absolute error (MAE) and a specification loss. The combination of the two frequency-domain losses can simultaneously minimize spectral regrowth and optimize the circuit design according to communication specifications.

Figure 1A:
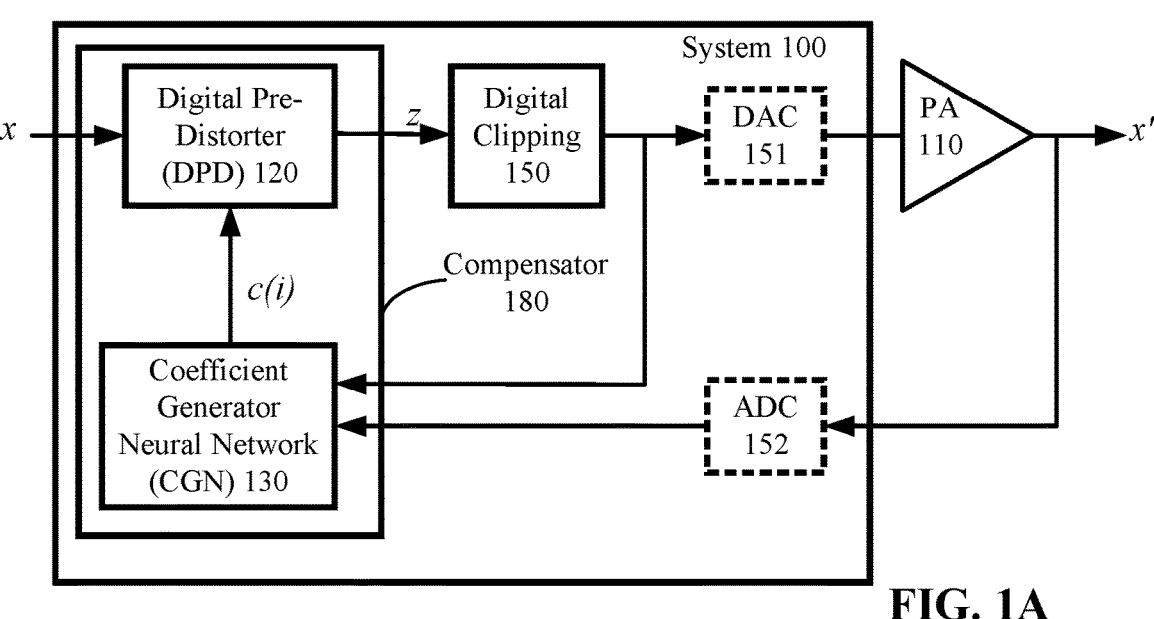
FIG. 1A illustrates a system compensating for distortions caused by a power amplifier according to a first embodiment.

FIG. 1A illustrates a system 100 operative to compensate for distortions caused by a power amplifier 110 according to an embodiment. The system 100 may be deployed in a wireless device; more specifically, in the transmitter portion of a wireless device. The system 100 includes a DPD 120, a CGN 130, and a digital clipping unit 150. The DPD 120 and the CGN 130 are collectively referred to as a compensator 180. The system 100 is coupled to the power amplifier 110. The system 100 may further include a digital-to-analog converter (DAC) 151 and an analog power amplifier 152 in an embodiment where the power amplifier 110 is an analog power amplifier. In another embodiment where the power amplifier 110 is a digital power amplifier, digital signals can be transmitted between the system 100 and the power amplifier 110 without conversions by the DAC 151 and the ADC 152. Thus, the DAC 151 and the ADC 152 are shown in dotted blocks to indicate that they may not be included in the system 100 in an alternative embodiment. The following description of signal compensation uses an analog power amplifier as an example; it is understood that the disclosed signal compensation also apply to a digital power amplifier.

The DPD 120 receives an input signal x and generates a pre-distorted signal z to compensate for the distortions caused by the power amplifier 110. In one embodiment, the DPD 120 is configurable with a set of compensator coefficients. The pre-distorted signal z output from the DPD 120 is clipped by a digital clipping unit 150 to limit the signal amplitude received by the power amplifier 110. The clipping may speed up the convergence in the training phase of the CGN 130. The clipped signal is converted by the DAC 151 into an analog signal, and the analog signal is amplified by the power amplifier 110 into an output signal x'. For each time instant t, the output signal x'(t) is generated from a time sequence of input signal x(t−p:t), where p is a configurable value.

The DPD's coefficients are calculated by the CGN 130. In one embodiment, the CGN 130 calculates the filter coefficients c(i)'s a running index for a total of N filter coefficients) at time instant t using the clipped signal and the ADC-converted power amplifier output x'(t−1−q:t−1), where q is a configurable value. The CGN 130 can update the filter coefficients c(i)'s at runtime.

In one embodiment, the CGN 130 is a neural network that is trained to generate coefficients for the DPD 120. Additionally, the power amplifier 110 can be modeled by a neural network that is trained to be used in the CGN training.

Figure 1B:
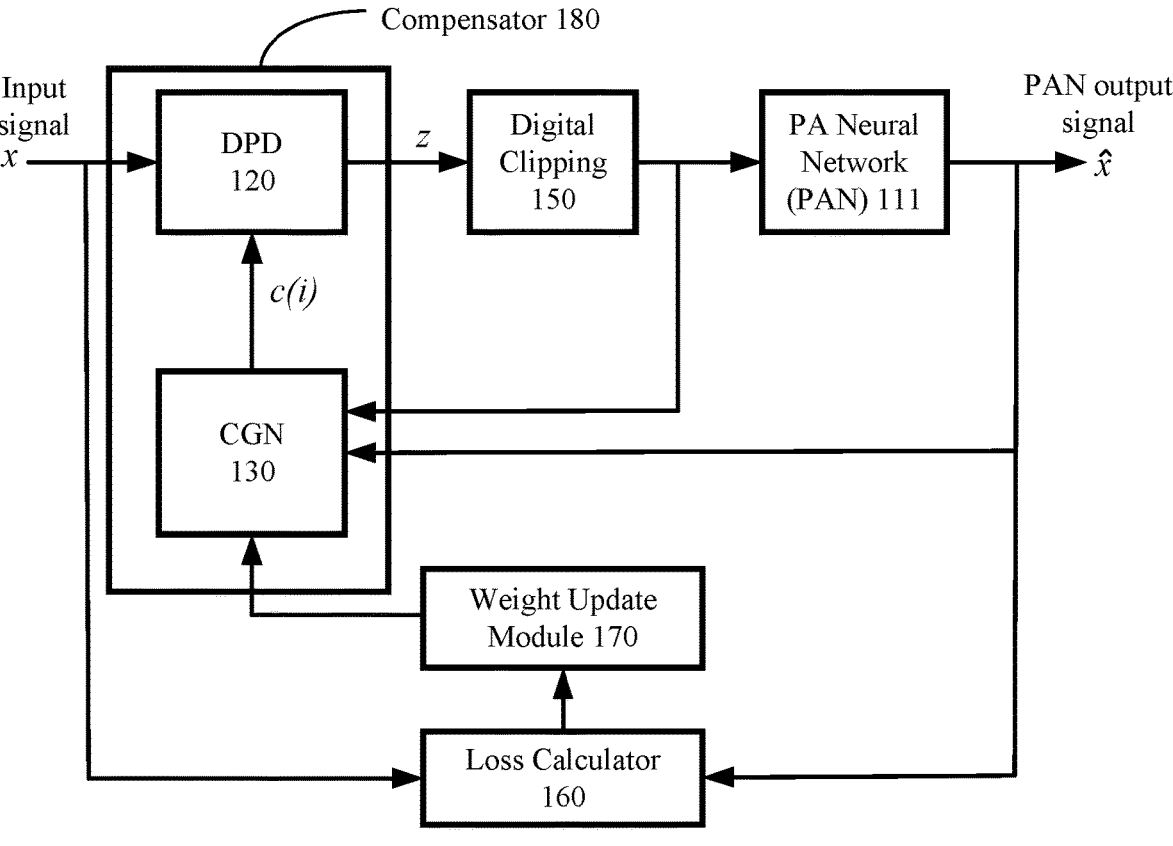
FIG. 1B is a block diagram illustrating a training configuration according to the first embodiment.

FIG. 1B is a block diagram illustrating a training configuration of the system 100 (FIG. 1A) according to one embodiment. The system 100 can be trained in two training stages. In the first stage, a power amplifier neural network (PAN) 111 is trained to characterize nonlinear behaviors and memory effects of non-differentiable power amplifier circuits (e.g., the power amplifier 110 in FIG. 1A). After the training of the PAN 111 is finished, its weights are fixed and used in the second training stage. The CGN 130 is trained in the second training stage. In one embodiment, one or both the PAN 111 and the CGN 130 are trained to optimize a multi-objective loss function. In one embodiment, the PAN 111 and the CGN 130 may be trained to optimize the same multi-objective loss function or two different multi-objective loss functions.

The training data for PAN 111 may be obtained from multiple real power amplifiers (i.e., power amplifier circuits) and processed as time sequence data with two channels including an in-phase (I) channel and a quadrature (Q) channel (e.g., $x=\{I_t, Q_t\}$, t=0, 1, . . . T). When training the PAN 111, the real power amplifiers' output is the ground truth and the losses are measured in terms of the difference between the ground truth and the PAN output. After the PAN 111 is trained and its filter weights are fixed, the trained PAN 111 is used in the training of the CGN 130. When training the CGN 130, the input to the DPD 120 is the ground truth and the losses are measured in terms of the difference between this ground truth and the PAN's output. In the following description of the multi-objective loss function, the ground truth is denoted as x and the PAN output is denoted as $\hat{x}$. It is noted that the ground truth x in the PAN 111 training is the real power amplifiers' output, and the ground truth x in the CGN 130 training is the input signal. Amplitude normalization is applied to the ground truth x and the PAN output $\hat{x}$ before the loss is calculated.

In one embodiment, the multi-objective loss function includes a combination of time-domain losses and frequency-domain losses. These losses may be weighted and summed up to generate a total loss value. During each epoch in the training phase, a loss calculator 160 evaluates the loss function (e.g., calculates the total loss value) and a weight update module 170 calculates a gradient with respect to the neural network weights. As an example, the weight update module 170 may implement a gradient-based optimization algorithm such as the Adam algorithm (Kingma et al., ADAM: a method for stochastic optimization, arXiv: 1412.6980).

In one embodiment, the multi-objective loss function may include a time-domain loss such as the mean square error (MSE) between the ground truth x and the PAN output $\hat{x}$. The MSE can be formulated as follows:

$$loss_{tMSE}(x,\hat{x})=\log \Sigma\|x-\hat{x}\|_2$$

In the Fourier-transformed spectrum domain, each complex number in an interval represents a specific frequency range. The absolute value describes power magnitude in the specific frequency point. Because the power magnitude of the transmitted signal is generally larger than the out-of-band signal, the mean absolute error (MAE) may be used instead of, or in addition to, the time-domain loss MSE to avoid over biasing on the in-band signals. Thus, the multi-objective loss function may include a frequency-domain loss such as the MAE between the STFT of the ground truth x and the STFT of the PAN output $\hat{x}$, where STFT stands for Short Time Fourier Transform which is applied on both x and $\hat{x}$. The MAE can be formulated as follows:

$$\text{loss}_{fMAE}(x,\hat{x})=\log \Sigma \|\text{STFT}(x)-\text{STFT}(\hat{x})\|_1$$

Instead of or in addition to the aforementioned losses, the multi-objective loss function may include a frequency-domain loss such as the specification loss computed from the adjacent channel leakage power ratio (ACLR). According to the 3GPP specification, ACLR is the ratio of the filtered mean power centered on the assigned channel frequency (i.e., in-band frequency) to the filtered mean power centered on an adjacent channel frequency (i.e., out-of-band frequency). The specification loss is defined to minimize the ACLR difference between the ground truth x and the PAN output $\hat{x}$. The formulations of ACLR and the specification loss are as follows:

$$ACLR(x) = \log \left( \frac{\sum_{in\_band} |STFT(x)|^2}{\sum_{out\_band} |STFT(x)|^2} \right)$$

$$loss_{fSPEC}(x, \hat{x}) = |ACLR(x) - ACLR(\hat{x})|$$

Instead of or in addition to the aforementioned losses, the multi-objective loss function may include a time-domain loss such as the error vector magnitude (EVM). The EVM measures how far the constellation points of a signal deviate from the ideal locations; e.g., the difference (i.e., error vectors) between PAN output symbols and ideal quadrature amplitude modulation (QAM) symbols. The EVM may be calculated as the root mean square (RMS) average amplitude of the error vectors, normalized to an ideal signal amplitude reference. Methods for measuring a transmitter's EVM are known in the art. EVM can be used to quantify the performance loss in the PAN output and can be optimized during training of the CGN 130.

In one embodiment, operations of the loss calculator 160 and the weight update module 170 may be performed by a general-purpose processor on a device where the power amplifier 110 is located. In another embodiment, the system 100 may include specialized hardware or accelerator for training neural networks. The multi-objective loss function used in the training of the PAN 111 and the CGN 130 may include the same or a different combination of the aforementioned losses.

Figure 2A:
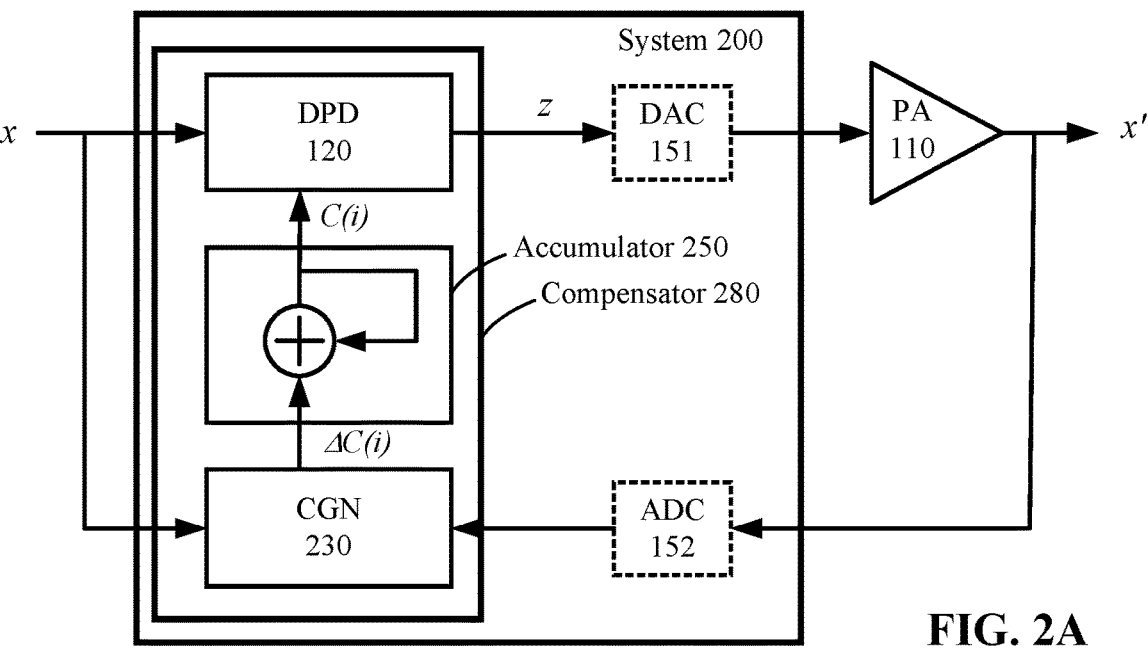
FIG. 2A illustrates a system compensating for distortions caused by a power amplifier according to a second embodiment.

FIG. 2A is a block diagram of a system 200 operative to compensate for distortions caused by the power amplifier 110 according to another embodiment. The system 200 may be deployed in a wireless device; more specifically, in the transmitter portion of a wireless device. The system 200 includes the DPD 120 and a CGN 230, which are collectively referred to as a compensator 280. The system 200 may also include the DAC 151 and the ADC 152 if the power amplifier 110 is an analog power amplifier.

The CGN 230 receives its inputs from the output of the power amplifier 110 and the input signal x. From the inputs, the CGN 230 generates delta coefficients $\Delta c(i)$'s, where i is a running index for a total of N filter coefficients. The delta coefficients are the increments or decrements of the coefficients in two consecutive update time instants. The compensator 280 includes an accumulator 250 to accumulate the delta coefficients, and to send the accumulated output (i.e., the filter coefficients $c(i)$'s) to the DPD 120. The coefficients may be initialized to zeros.

Figure 2B:
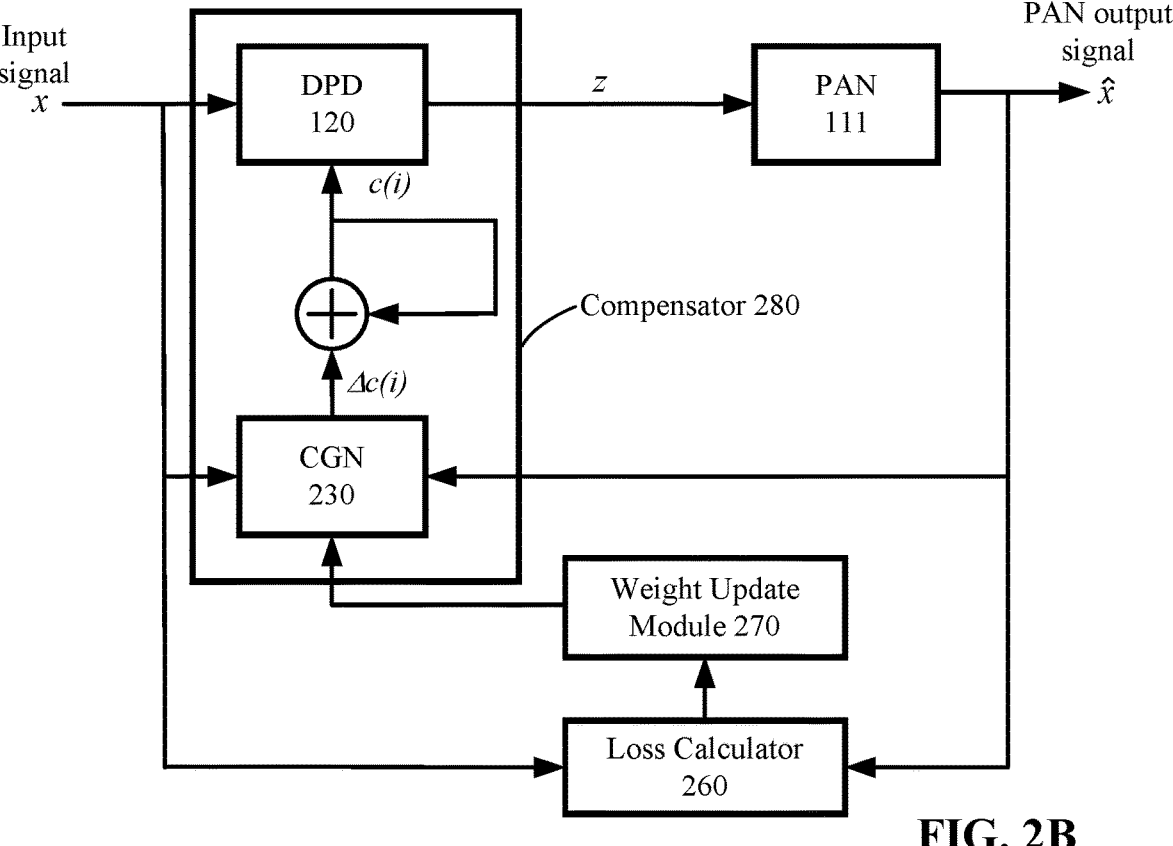
FIG. 2B is a block diagram illustrating a training configuration according to the second embodiment.

FIG. 2B is a block diagram illustrating the components used for training the CGN 230 according to one embodiment. The training follows the same two-stage training process as described before in connection with FIG. 1B. When training the PAN 111 and then the CGN 230, a loss calculator 260 calculates a multi-objective loss function that measures the difference between the ground truth x and the PAN output $\hat{x}$. The ground truth x in the PAN 111 training is the real power amplifiers' output, and the ground truth x in the DPD neural network 420 training is the input signal. A weight update module 270 updates the neural network weights based on a gradient with respect to the neural network weights. The multi-objective loss function may be a combination of one or more time-domain losses (e.g., MSE, EVM) and one or more frequency-domain losses (e.g., MAE, ACLR-based specification loss). The multi-objective loss function used in the training of the PAN 111 and the CGN 230 may include the same or a different combination of the aforementioned losses.

Figure 3A:
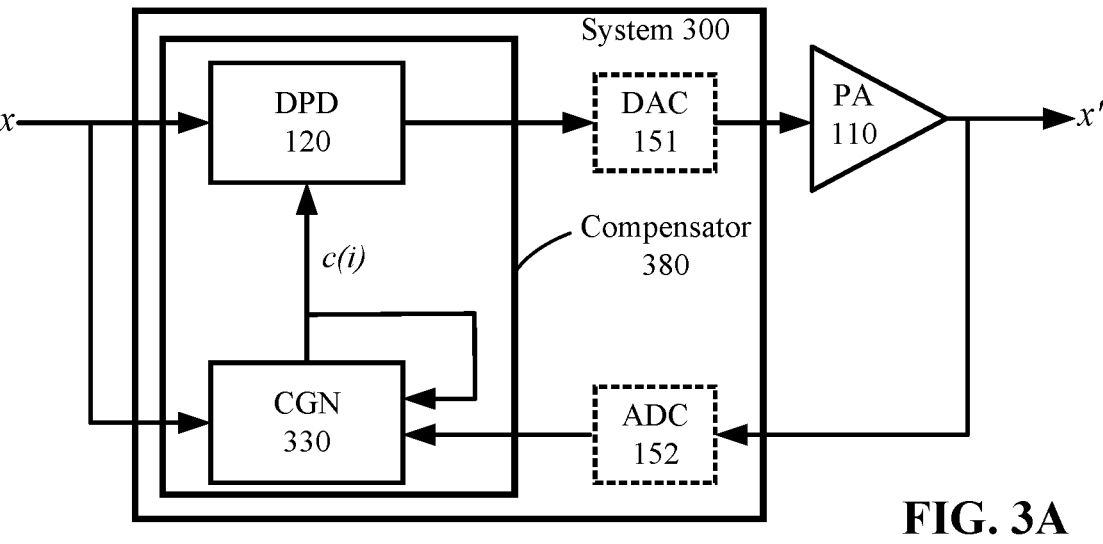
FIG. 3A illustrates a system compensating for distortions caused by a power amplifier according to a third embodiment.

FIG. 3A is a block diagram of a system 300 operative to compensate for distortions caused by the power amplifier 110 according to another embodiment. The system 300 may be deployed in a wireless device; more specifically, in the transmitter portion of a wireless device. The system 300 includes the DPD 120 and a CGN 330, which are collectively referred to as a compensator 380. The system 300 may also include the DAC 151 and the ADC 152 if the power amplifier 110 is an analog power amplifier.

The CGN 330 receives its inputs from the output of the power amplifier 110, the input signal x, and the previously-generated coefficients. From the inputs, the CGN 230 generates filter coefficients $c(i)$'s, where i is a running index for a total of N filter coefficients. The output of the CGN 330 is sent to the DPD 120.

Figure 3B:
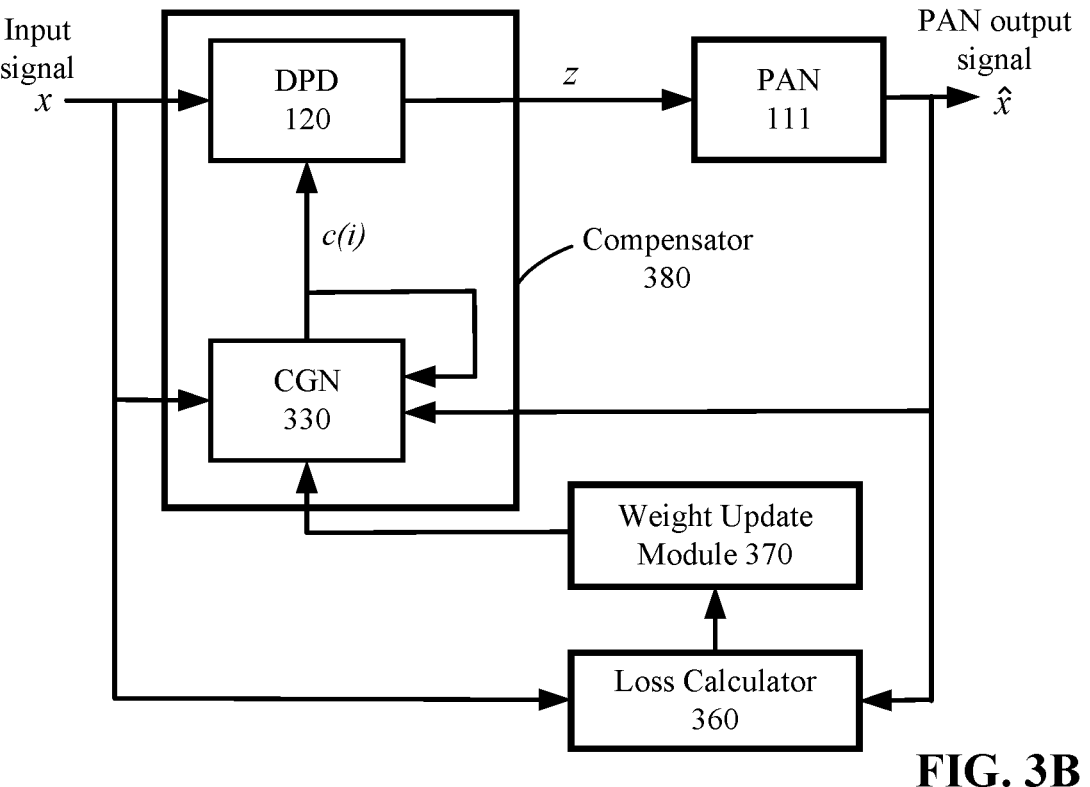
FIG. 3B is a block diagram illustrating a training configuration according to the third embodiment.

FIG. 3B is a block diagram illustrating the components used for training the CGN 330 according to one embodiment. The training follows the same two-stage training process as described before in connection with FIG. 1B. When training the PAN 111 and then the CGN 330, a loss calculator 360 calculates a multi-objective loss function that measures the difference between the ground truth x and the PAN output $\hat{x}$. The ground truth x in the PAN 111 training is the real power amplifiers' output, and the ground truth x in the DPD neural network 420 training is the input signal. A weight update module 370 updates the neural network weights based on a gradient with respect to the neural network weights. The multi-objective loss function may be a combination of one or more time-domain losses (e.g., MSE, EVM) and one or more frequency-domain losses (e.g., MAE, ACLR-based specification loss). The multi-objective loss function used in the training of the PAN 111 and the CGN 330 may include the same or a different combination of the aforementioned losses.

Figure 4A:
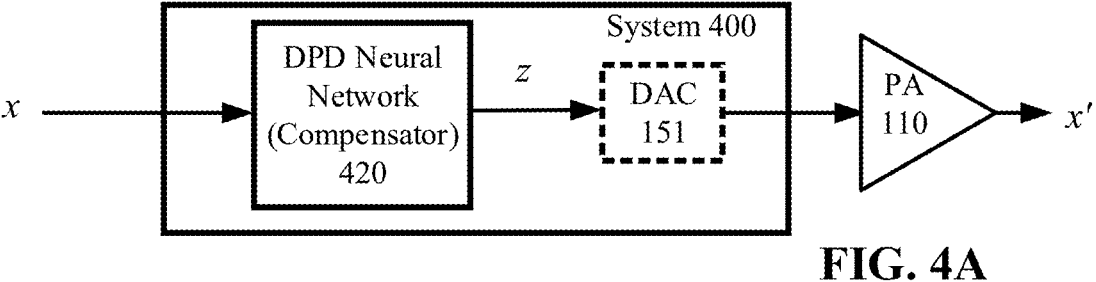
FIG. 4A illustrates a system compensating for distortions caused by a power amplifier according to a fourth embodiment.

FIG. 4A is a block diagram of a system 400 operative to compensate for distortions caused by the power amplifier 110 according to another embodiment. The system 400 includes a DPD neural network 420, which is a neural network trained to generate a pre-distorted signal z. The DPD neural network 420 is the compensator for the power amplifier 110. In an embodiment where the power amplifier is analog, the pre-distorted signal z is converted to an analog signal by the DAC 151 for the power amplifier 110.

Figure 4B:
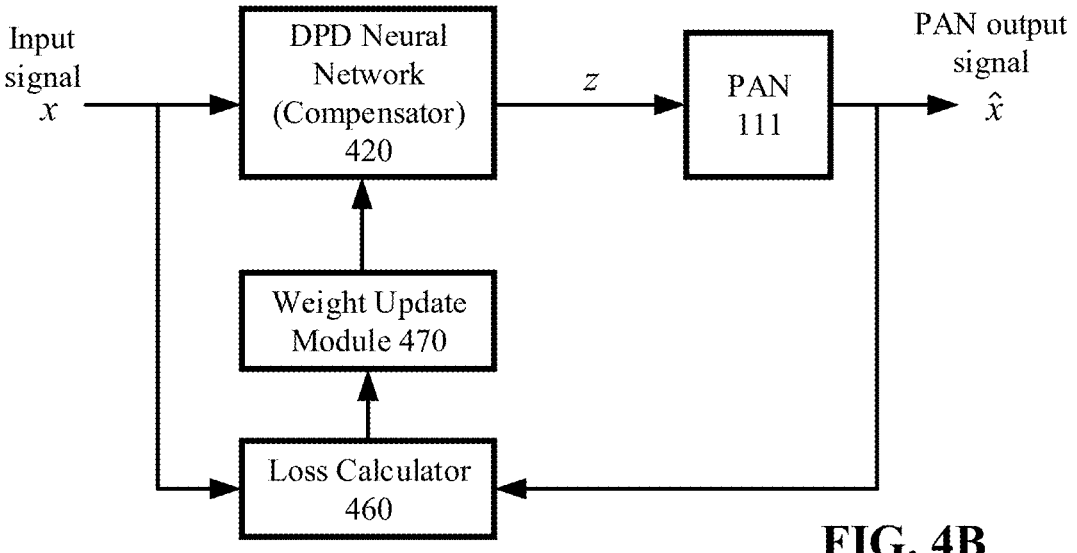
FIG. 4B is a block diagram illustrating a training configuration according to the fourth embodiment.

FIG. 4B is a block diagram illustrating the components used for training the DPD neural network 420 according to one embodiment. The training follows the same two-stage training process as described before in connection with FIG. 1B. When training the PAN 111 and then the DPD neural network 420, a loss calculator 460 calculates a multi-objective loss function that measures the difference between the ground truth x and the PAN output x̂. The ground truth x in the PAN 111 training is the real power amplifiers' output, and the ground truth x in the DPD neural network 420 training is the input signal. A weight update module 470 updates the neural network weights based on a gradient with respect to the neural network weights. The multi-objective loss function may be a combination of one or more time-domain losses (e.g., MSE, EVM) and one or more frequency-domain losses (e.g., MAE, ACLR-based specification loss). The multi-objective loss function used in the training of the PAN 111 and the DPD neural network 420 may include the same or a different combination of the aforementioned losses.

FIG. 5 is a flow diagram illustrating a method 500 of compensating for power amplifier distortions according to one embodiment. Method 500 may be performed by an electronic device, such as the device 600 in FIG. 6. In some embodiments, method 500 may be performed by any of the systems 100, 200, 300, and 400 in FIGS. 1A, 2A, 3A, and 4A, respectively. Alternatively, method 500 may be performed by a server computer system including memory and processing hardware. The processing hardware performs neural network training and provides the trained neural networks to a device in which the power amplifier is located.

The system at step 510 trains a power amplifier neural network (PAN) to model a power amplifier circuit using pre-determined input and output signal pairs that characterize the power amplifier circuit. The system at step 520 trains a compensator to pre-distort a signal received by the PAN. The compensator may be the compensator 180 in FIG. 1A, which includes both the DPD 120 and the CGN 130. Alternatively, the compensator may be the compensator 280 in FIG. 2A, which includes the DPD 120, the accumulator 250, and the CGN 230. In another embodiment, the compensator may be the compensator 380 in FIG. 3A, which includes the DPD 120 and the CGN 330. In yet another embodiment, the compensator may be the compensator 420 in FIG. 4A, which is also referred to as the DPD neural network 420.

The compensator uses a neural network that is trained to optimize a loss between a compensator input and a PAN output. The loss is calculated according to a multi-objective loss function that includes one or more time-domain losses and one or more frequency-domain losses. After the training phase at steps 510 and 520 are completed, the system starts an inference phase at step 530 where the compensator performs signal compensation to output a pre-distorted signal to the power amplifier circuit.

In one embodiment, the multi-objective loss function may include at least a frequency-domain specification loss, which is a difference between an ACLR of the compensator input and an ACLR of the PAN output. In one embodiment, the multi-objective loss function may include at least a frequency-domain MAE calculated from a difference between the STFT of the compensator input and the STFT of the PAN output. In one embodiment, the multi-objective loss function may include at least a time-domain EVM calculated from a difference between PAN output symbols and ideal quadrature amplitude modulation (QAM) symbols. In one embodiment, the multi-objective loss function may include at least a time-domain MSE calculated from a difference between the compensator input and the PAN output. In one embodiment, the multi-objective loss function for training the PAN and the compensator may include any combination of the aforementioned frequency-domain and time-domain losses; a non-limiting example includes a combination of the time-domain MSE, the frequency-domain MAE, and the frequency-domain specification loss.

In one embodiment, training the compensator includes the operations of training a CGN to generate filter coefficients for a DPD that pre-distorts the signal received by the PAN. The CGN is trained to optimize the loss between the input of the DPD and the PAN output. The inputs of the CGN may include the PAN output and a digitally-clipped output of the DPD.

In another embodiment, training the compensator includes the operations of training a CGN to generate delta coefficients and to accumulate the delta coefficients over time to generate filter coefficients for a DPD that pre-distorts the signal received by the PAN. The CGN is trained to optimize the loss between the input of the DPD and the PAN output. In yet another embodiment, training the compensator includes the operations of training a DPD neural network that pre-distorts the signal received by the PAN. The DPD neural network is trained to optimize the loss between the input of the DPD neural network and the PAN output.

Figure 6:
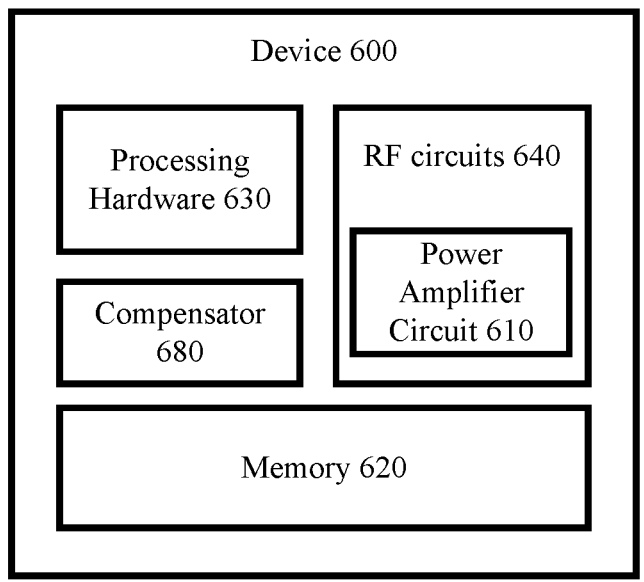
FIG. 6 is a block diagram illustrating a device that includes a compensator according to one embodiment.

FIG. 6 is a diagram illustrating a device 600 including a compensator to compensate for the distortions caused by a power amplifier according to one embodiment. The device 600 may be a wireless device. The device 600 includes processing hardware 630, which can include any general-purpose and/or special-purpose computing circuitry, such as a central processing circuit (CPU), a graphics processing unit (GPU), a digital signal processor (DSP), a media processor, a neural processing circuit (NPU), AI accelerator, application-specific integrated circuit (ASIC), or the like. In one embodiment, the processing hardware 630 may evaluate the aforementioned multi-objective loss function and neural network weight updates during training of a power amplifier neural network (PAN), a coefficient generator neural network (CGN), and/or a digital pre-distorter (DPD) neural network.

The device 600 further includes a memory 620. The memory 620 may include on-chip and off-chip memory devices such as dynamic random access memory (DRAM), static RAM (SRAM), flash memory, and other volatile or non-volatile memory devices. The memory 620 may include instructions, which when executed by the processing hardware 610, cause the processing hardware 610 to perform neural network training of a PAN, a CGN, and/or a DPD neural network. The memory 620 may also store neural network models for use as the aforementioned PAN, CGN, and/or DPD neural network.

The neural networks or neural network modules described herein may include one or more of a fully-connected network (FC), a convolutional neural network (CNN), a recurrent neural network (RNN), a graph neural network (GNN), a self-attestation-based network such as a transformer, and the like. The aforementioned PAN, CGN, and/or DPD neural network may be the same or different neural networks.

A non-limiting example of the aforementioned PAN, CGN, and/or DPD neural network is a CNN composed of 6 convolution layers with an input sequence of 128 sample points (input length). In each sample, two input channels are used for I and Q. Each layer is a 1-D convolution with a kernel size of 3 and a stride of 1, and the output channel number for each layer is 16-32-64-64-128-2. Except for the last output layer, each convolution layer is followed by a batch normalization layer and PReLU activation function.

The device 600 also includes RF circuits 640, which further includes at least a power amplifier circuit 610. The power amplifier circuit 610 may be an analog power amplifier circuit or a digital power amplifier circuit. Distortions caused by the power amplifier circuit 610 can be compensated by a compensator 680, which may be any of the compensators 180 (FIG. 1A), 280 (FIG. 2A), 380 (FIG. 3A), or 420 (FIG. 4A). The compensator 680 includes a neural network for generating filter coefficients, delta coefficients, or pre-distorted signals. The compensator 680 may include general-purpose or specialized hardware to perform neural network operations. It is understood the embodiment of FIG. 6 is simplified for illustration purposes. Additional hardware components may be included.

Referring to FIGS. 1B, 2B, 3B, and 4B, one or more of the PAN 111, the compensators (180, 280, 380, 420), the CGNs (130, 230, 330), and the DPDs (120, 220, 320) may be implemented in hardware circuitry, software executed by hardware circuitry, or a combination of hardware and software. The hardware circuitry may be special-purpose or general-purpose hardware. Software may be stored on any non-transitory computer-readable medium for use by the device 600 or by methods executed by the device 600.

In this disclosure, a learning-based framework is proposed for power amplifier compensation. The framework improves the performance of power amplifiers used in a 5G communication network. The framework uses deep neural networks (DNNs) to learn the power amplifier's behaviors and characteristics. With the trained neural networks which represent the non-differentiable power amplifier circuits, the corresponding pre-distortion compensation is then learned in an end-to-end training paradigm. In addition, two frequency-domain losses (i.e., MAE and the ACLR-based specification loss) can be used to simultaneously minimize spectral regrowth and optimize the circuit design according to communication specifications.

Various functional components, blocks, or modules have been described herein. As will be appreciated by persons skilled in the art, the functional blocks or modules may be implemented through circuits (either dedicated circuits or general-purpose circuits, which operate under the control of one or more processors and coded instructions), which will typically comprise transistors that are configured in such a way as to control the operation of the circuity in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method of compensating for power amplifier distortions, comprising:
   training a power amplifier neural network (PAN) to model a power amplifier circuit using pre-determined input and output signal pairs that characterize the power amplifier circuit;
   training a compensator to pre-distort a signal received by the PAN, wherein the compensator uses a neural network trained to optimize a loss between a compensator input and a PAN output, and the loss is calculated according to a multi-objective loss function that includes one or more time-domain loss functions and one or more frequency-domain loss functions; and
   performing signal compensation by the trained compensator to thereby output a pre-distorted signal to the power amplifier circuit, wherein the one or more time-domain loss functions include at least one of:
   a time-domain error vector magnitude (EVM) calculated from a difference between PAN output symbols and ideal quadrature amplitude modulation (QAM) symbols, and
   a time-domain mean square error (MSE) calculated from a difference between the compensator input and the PAN output.

2. The method of claim 1, wherein training the compensator further comprises:
   training a coefficient generator neural network (CGN) to generate filter coefficients for a digital pre-distorter (DPD) that pre-distorts the signal received by the PAN, wherein the CGN is trained to optimize the loss between the input of the DPD and the PAN output.

3. The method of claim 2, wherein inputs of the CGN includes the PAN output and a digitally-clipped output of the DPD.

4. The method of claim 1, wherein training the compensator further comprises:
   training a coefficient generator neural network (CGN) to generate delta coefficients; and
   accumulating the delta coefficients over time to generate filter coefficients for a digital pre-distorter (DPD) that pre-distorts the signal received by the PAN, wherein the CGN is trained to optimize the loss between the input of the DPD and the PAN output.

5. The method of claim 1, wherein training the compensator further comprises:
   training a digital pre-distorter (DPD) neural network that pre-distorts the signal received by the PAN, wherein the DPD neural network is trained to optimize the loss between the input of the DPD neural network and the PAN output.

6. A system comprising:
   memory to store neural network models; and
   processing hardware coupled to the memory, the processing hardware operative to:
   train a power amplifier neural network (PAN) to model a power amplifier circuit using pre-determined input and output signal pairs that characterize the power amplifier circuit;
   train a compensator to pre-distort a signal received by the PAN, wherein the compensator uses a neural network trained to optimize a loss between a compensator input and a PAN output, and the loss is calculated according to a multi-objective loss function that includes one or more time-domain loss functions and one or more frequency-domain loss functions; and
   perform signal compensation by the trained compensator to thereby output a pre-distorted signal to the power amplifier circuit, wherein the one or more time-domain loss functions include at least one of:
   a time-domain error vector magnitude (EVM) calculated from a difference between PAN output symbols and ideal quadrature amplitude modulation (QAM) symbols, and
   a time-domain mean square error (MSE) calculated from a difference between the compensator input and the PAN output.

7. The system of claim 6, wherein the power amplifier circuit is a digital circuit.

8. The system of claim 6, wherein the power amplifier circuit is an analog circuit.

9. The system of claim 6, wherein the processing hardware is further operative to:

train a coefficient generator neural network (CGN) to generate filter coefficients for a digital pre-distorter (DPD) that pre-distorts the signal received by the PAN, wherein the CGN is trained to optimize the loss between the input of the DPD and the PAN output.

10. The system of claim 6, wherein the processing hardware is further operative to:

train a coefficient generator neural network (CGN) to generate delta coefficients; and accumulate the delta coefficients over time to generate filter coefficients for a digital pre-distorter (DPD) that pre-distorts the signal received by the PAN, wherein the CGN is trained to optimize the loss between the input of the DPD and the PAN output.

11. The system of claim 6, wherein the processing hardware is further operative to:

train a digital pre-distorter (DPD) neural network that pre-distorts the signal received by the PAN, wherein the DPD neural network is trained to optimize the loss between the input of the DPD neural network and the PAN output.

12. A method of compensating for power amplifier distortions, comprising:

training a power amplifier neural network (PAN) to model a power amplifier circuit using pre-determined input and output signal pairs that characterize the power amplifier circuit;

training a compensator to pre-distort a signal received by the PAN, wherein the compensator uses a neural network trained to optimize a loss between a compensator input and a PAN output, and the loss is calculated according to a multi-objective loss function that includes one or more time-domain loss functions and one or more frequency-domain loss functions; and performing signal compensation by the trained compensator to thereby output a pre-distorted signal to the power amplifier circuit, wherein the one or more frequency-domain loss functions include at least one of:

a frequency-domain specification loss, which is a difference between an adjacent channel leakage power ratio (ACLR) of the compensator input and an ACLR of the PAN output, wherein the ACLR is a ratio of filtered mean power centered on an assigned channel frequency to filtered mean power centered on an adjacent channel frequency, and a frequency-domain mean absolute error (MAE) calculated from a difference between Short Time Fourier Transform (STFT) of the compensator input and STFT of the PAN output.

13. The method of claim 12, wherein training the compensator further comprises:

training a coefficient generator neural network (CGN) to generate filter coefficients for a digital pre-distorter (DPD) that pre-distorts the signal received by the PAN, wherein the CGN is trained to optimize the loss between the input of the DPD and the PAN output.

14. The method of claim 12, wherein training the compensator further comprises:

training a coefficient generator neural network (CGN) to generate delta coefficients; and accumulating the delta coefficients over time to generate filter coefficients for a digital pre-distorter (DPD) that pre-distorts the signal received by the PAN, wherein the CGN is trained to optimize the loss between the input of the DPD and the PAN output.

15. The method of claim 12, wherein training the compensator further comprises:

training a digital pre-distorter (DPD) neural network that pre-distorts the signal received by the PAN, wherein the DPD neural network is trained to optimize the loss between the input of the DPD neural network and the PAN output.

16. A system comprising:

memory to store neural network models; and processing hardware coupled to the memory, the processing hardware operative to:

train a power amplifier neural network (PAN) to model a power amplifier circuit using pre-determined input and output signal pairs that characterize the power amplifier circuit;

train a compensator to pre-distort a signal received by the PAN, wherein the compensator uses a neural network trained to optimize a loss between a compensator input and a PAN output, and the loss is calculated according to a multi-objective loss function that includes one or more time-domain loss functions and one or more frequency-domain loss functions; and perform signal compensation by the trained compensator to thereby output a pre-distorted signal to the power amplifier circuit, wherein the one or more frequency-domain loss functions include at least one of:

a frequency-domain specification loss, which is a difference between an adjacent channel leakage power ratio (ACLR) of the compensator input and an ACLR of the PAN output, wherein the ACLR is a ratio of filtered mean power centered on an assigned channel frequency to filtered mean power centered on an adjacent channel frequency, and a frequency-domain mean absolute error (MAE) calculated from a difference between Short Time Fourier Transform (STFT) of the compensator input and STFT of the PAN output.

17. The system of claim 16, wherein the power amplifier circuit is a digital circuit.

18. The system of claim 16, wherein the power amplifier circuit is an analog circuit.

19. The system of claim 16, wherein the processing hardware is further operative to:

train a coefficient generator neural network (CGN) to generate filter coefficients for a digital pre-distorter (DPD) that pre-distorts the signal received by the PAN, wherein the CGN is trained to optimize the loss between the input of the DPD and the PAN output.

20. The system of claim 16, wherein the processing hardware is further operative to:

train a coefficient generator neural network (CGN) to generate delta coefficients; and accumulate the delta coefficients over time to generate filter coefficients for a digital pre-distorter (DPD) that pre-distorts the signal received by the PAN, wherein the CGN is trained to optimize the loss between the input of the DPD and the PAN output.

21. The system of claim 16, wherein the processing hardware is further operative to:

train a digital pre-distorter (DPD) neural network that pre-distorts the signal received by the PAN, wherein the DPD neural network is trained to optimize the loss between the input of the DPD neural network and the PAN output.

\* \* \* \* \*